United States Patent
Lee et al.

(10) Patent No.: US 11,105,659 B2
(45) Date of Patent: Aug. 31, 2021

(54) DUAL BRILLOUIN DISTRIBUTED OPTICAL FIBER SENSOR AND SENSING METHOD USING BRILLOUIN SCATTERING WHICH ALLOW HIGH-SPEED EVENT DETECTION AND PRECISE MEASUREMENT

(71) Applicant: KOREA INSTITUTE OF SCIENCE AND TECHNOLOGY, Seoul (KR)

(72) Inventors: Kwan Il Lee, Seoul (KR); Gukbeen Ryu, Seoul (KR); Sang Bae Lee, Seoul (KR); In Soo Kim, Seoul (KR); Wonsuk Lee, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 141 days.

(21) Appl. No.: 16/687,692

(22) Filed: Nov. 19, 2019

(65) Prior Publication Data
US 2021/0148736 A1   May 20, 2021

(51) Int. Cl.
| G01D 5/353 | (2006.01) |
| H01S 5/00 | (2006.01) |
| H01S 5/12 | (2021.01) |
| G02B 27/28 | (2006.01) |

(52) U.S. Cl.
CPC ......... *G01D 5/35364* (2013.01); *G02B 27/28* (2013.01); *H01S 5/00* (2013.01); *H01S 5/12* (2013.01)

(58) Field of Classification Search
CPC ......... G01D 5/35364; H01S 5/00; H01S 5/12; G02B 27/28
See application file for complete search history.

(56) References Cited

U.S. PATENT DOCUMENTS

| 10,066,973 B2 * | 9/2018 | Horiguchi ............. H01S 5/0071 |
| 2011/0122417 A1 | 5/2011 | Molin et al. |
| 2012/0162639 A1 | 6/2012 | Farhadiroushan et al. |
| 2016/0273999 A1 | 9/2016 | Notate et al. |

(Continued)

FOREIGN PATENT DOCUMENTS

| JP | 201444129 A | 3/2014 |
| JP | 201749255 A | 3/2017 |
| KR | 1020130099353 A | 9/2013 |

(Continued)

OTHER PUBLICATIONS

Bin Wang et al., "Dynamic strain measurement with kHz-level repetition rate and centimeter-level spatial resolution based on Brillouin optical correlation domain analysis," Optics Express, Mar. 2018, pp. 6916-6928, vol. 26, No. 6.

(Continued)

*Primary Examiner* — Seung C Sohn
(74) *Attorney, Agent, or Firm* — Cantor Colburn LLP

(57) ABSTRACT

Embodiments relate to a dual Brillouin distributed optical fiber sensing system and a sensing method using Brillouin scattering that detects an event area in which an event occurred quickly by simultaneously measuring multiple correlation points located in an optical fiber under test by using a pump signal modulated with a pulsed gating signal and a continuous wave probe signal, and then precisely measures the corresponding event area by using the probe signal modulated with the pulsed gating signal and the pump signal.

18 Claims, 8 Drawing Sheets

(56) References Cited

U.S. PATENT DOCUMENTS

2020/0124497 A1* 4/2020 Furukawa ............ G01M 11/319

FOREIGN PATENT DOCUMENTS

| KR | 101326859 B1 | 11/2013 |
| KR | 101358942 B1 | 2/2014 |
| KR | 101823454 B1 | 1/2018 |
| KR | 1020180010049 A | 1/2018 |

OTHER PUBLICATIONS

Yong Hyun Kim et al., "Brillouin optical correlation domain analysis with more than 1 million effective sensing points based on differential measurement," Optics Express, Dec. 2015, pp. 33241-33248, vol. 23, No. 26.

* cited by examiner

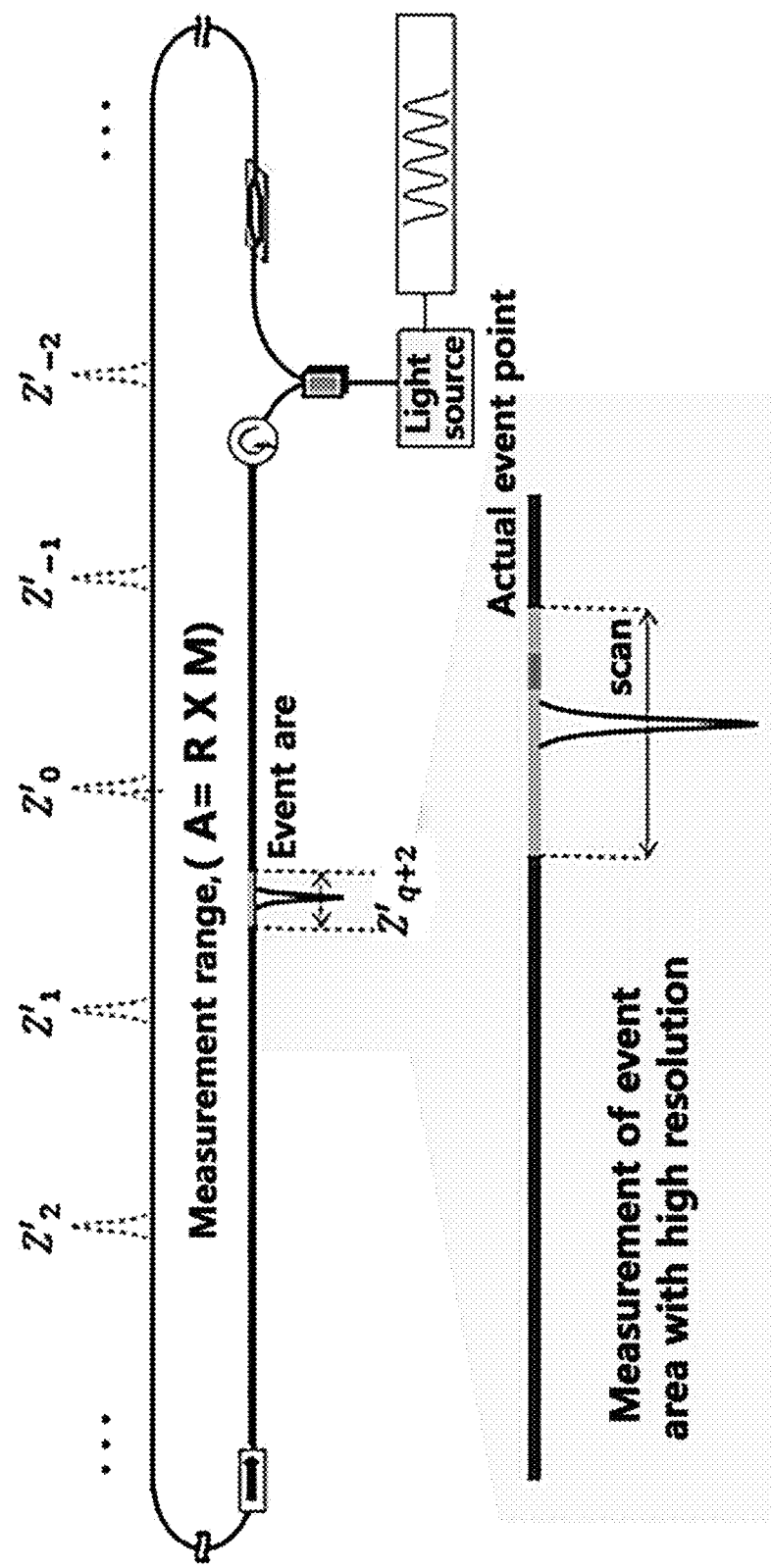

DUAL BRILLOUIN DISTRIBUTED OPTICAL FIBER SENSOR AND SENSING METHOD USING BRILLOUIN SCATTERING WHICH ALLOW HIGH-SPEED EVENT DETECTION AND PRECISE MEASUREMENT

BACKGROUND

1. Field

Embodiments relate to a dual sensing Brillouin distributed optical fiber sensing system and a sensing method using Brillouin scattering which allows high-speed event detection and precise measurement, and more particularly, to dual sensing that detects an event area in which abnormality occurred at high speed in a wide area and precisely measures an event point located in the detected event area.

[Description about National Research and Development Support]

This study was supported by the Ministry of Science and ICT, Republic of Korea (INNOPOLIS FOUNDATION, Project No. 1711062884) under the superintendence of Teralink Communication Incorporated.

2. Description of the Related Art

Brillouin frequency shift caused by Brillouin scattering occurring in an optical fiber linearly changes depending on temperature and strain applied to the optical fiber, and a physical change at the point is determined by measuring the value of Brillouin frequency shift. There are various techniques for distributed sensors using Brillouin scattering, for example, time domain, frequency domain or correlation domain technique.

Among them, a spatially selective Brillouin Optical Correlation Domain Analysis (BOCDA) based sensor uses, as measurement points, correlation points (CP) periodically appearing at points where a frequency difference between pump beam and probe beam is constant, and thus is very useful due to high spatial resolution and arbitrary sensing point selectivity.

However, when measuring a wide measurement range (for example, 1.5 km) with high spatial resolution, the BOCDA based distributed sensor requires much time to measure the corresponding range.

RELATED LITERATURES

Patent Literatures (Patent Literature 1) Patent No. 10-1358942

SUMMARY

According to an aspect of the present disclosure, it is possible to provide a dual Brillouin distributed optical fiber sensing system and a sensing method using Brillouin scattering which detects an abnormal point at high speed in a wide area using Brillouin Optical Correlation Domain Analysis (BOCDA) and precisely measures the detected abnormal point.

A dual Brillouin distributed optical fiber sensing system according to an aspect of the present disclosure may include an optical fiber under test, a light source unit which generates a laser beam modulated with a modulating signal having a modulation frequency, a light modulation unit configured to generate a pump signal and a probe signal using the laser beam, and apply the pump signal and the probe signal to the optical fiber under test from different directions, wherein the pump signal is time gated using a pulsed gating signal, a light detection unit which detects Brillouin scattered light generated by the pump signal and the probe signal at correlation points located in the optical fiber under test, and a control unit which determines whether an event occurred in the optical fiber under test based on the detected Brillouin scattered light, and when the event occurred, sets an event area including a point at which the event occurred. Here, when the event area is not set, the light modulation unit is configured to generate a probe signal by shifting a frequency of the laser beam by a predetermined offset frequency, and when the event area is set, to generate a probe signal time gated by further using a gating signal.

In an embodiment, the light modulation unit may include a first modulator which changes the frequency of the laser beam by a predetermined offset frequency, a first waveform generator which generates a constant signal when the event area is not set, and generates a pulsed gating signal when the event area is set, and a second modulator configured to generate a first optical signal using the signal generated from the first waveform generator.

In an embodiment, the first waveform generator may generate a pulsed gating signal having a same temporal width as a reciprocal of the modulation frequency of the laser beam.

In an embodiment, the light modulation unit may include a second waveform generator which generates a pulsed gating signal, and a third modulator configured to generate a pump beam using the gating signal of the second waveform generator. Here, the second waveform generator may shift a phase of the gating signal.

In an embodiment, the control unit may include a data collector which acquires a signal for the Brillouin scattered light, and a data processor which calculates a Brillouin gain and a Brillouin frequency using the signal for the Brillouin scattered light, determines whether an event occurred based on the Brillouin frequency, and sets a location at which the event occurred as an event area.

In an embodiment, the data processor may be configured to calculate the Brillouin gain at each of multiple correlation points on the light path when the event area is not set, and calculate the Brillouin gain at one correlation point located on the event area when the event area is set.

In an embodiment, when a change in the Brillouin frequency at a location of the optical fiber under test is above a predetermined range, the data processor may determine that an event occurred at the location.

In an embodiment, when the event area is not set, the modulation frequency has a first modulation frequency variation for setting a first spatial resolution, and when the event area is set, the modulation frequency has a second modulation frequency variation for setting a second spatial resolution. Here, the first spatial resolution is lower than the second spatial resolution.

In an embodiment, the event area may be set by the control unit based on the first spatial resolution.

In an embodiment, the dual Brillouin distributed optical fiber sensing system may further include a lock-in amplifier to detect an averaged signal for one or more Brillouin scattered light generated at a same correlation point.

In an embodiment, the lock-in amplifier may be configured to operate only when the event area is set.

A sensing method using Brillouin scattering according to another aspect of the present disclosure may include generating a first laser beam modulated with a first modulating signal, generating a pump signal and a first probe signal from the first laser beam, wherein the first probe signal is different from a frequency of the pump signal, and the pump signal is generated by modulation with a pulsed gating signal, applying the pump signal and the probe signal to an optical fiber under test in different directions, detecting a first Brillouin scattered light generated in the optical fiber under test, and calculating a first Brillouin frequency in the optical fiber under test, determining whether an event occurred based on the first Brillouin frequency, and setting an event area including a location at which the event occurred, generating a second laser beam signal modulated with a second modulating signal, generating a second probe signal time gated using a pulsed gating signal, applying the second probe signal and the pump signal to the optical fiber under test in different directions, and calculating a second Brillouin frequency in the event area based on a second Brillouin scattered light generated at a correlation point located in the event area. Here, the first modulating signal has a first modulation frequency variation for setting a first spatial resolution, and the second modulating signal has a second modulation frequency variation for setting a second spatial resolution that is higher than the first spatial resolution.

In an embodiment, the detecting the first Brillouin scattered light generated in the optical fiber under test and calculating the first Brillouin frequency in the optical fiber under test may include detecting Brillouin scattered light generated at multiple correlation points located in the optical fiber under test, calculating a Brillouin gain at each of the multiple correlation points using the Brillouin scattered light for the multiple correlation points, and calculating a Brillouin frequency for each of the multiple correlation points based on the first Brillouin gain.

In an embodiment, the calculating the first Brillouin frequency in the optical fiber under test may further include calculating the Brillouin frequency for each of the multiple correlation points at partial distribution representing Brillouin frequency distribution near the corresponding correlation point by controlling the first modulation frequency.

In an embodiment, the setting the event area based on the first Brillouin gain may include detecting a correlation point having a change in the Brillouin frequency above a predetermined range, and setting an event area based on a location of the correlation point.

In an embodiment, the sensing method using Brillouin scattering may further include, after the generating the second probe signal, controlling a phase difference between the pump signal and the second probe signal so that one correlation point is located in the event area.

In an embodiment, in the step of detecting the second Brillouin scattered light generated at the correlation point located in the event area, an averaged signal for one or more Brillouin scattered light generated at the one correlation point may be detected.

In an embodiment, the sensing method using Brillouin scattering may further include calculating the Brillouin frequency for one correlation point located in the event area at partial distribution representing Brillouin frequency distribution near the corresponding correlation point by controlling the second modulation frequency.

According to the dual Brillouin distributed optical fiber sensing system in accordance with an aspect of the present disclosure, it is possible to quickly detect a change in the surrounding environment over the wide range (for example, the entire measurable range) with low resolution by simultaneously using one or more correlation points located in the measurement range as a measurement point, and when a suspicious change in the surrounding environment is detected (i.e., when an event occurred), precisely measure a specific area (event area) in which the change is detected, with high resolution.

By changing the resolution depending on the measurement range as described above, the system is able to detect a change in surrounding environment around the optical fiber such as temperature and strain quickly and accurately.

Additionally, the system is able to detect an averaged signal for one or more Brillouin scattered light generated at the same correlation point by using the lock-in amplifier in the precise measurement process, thereby detecting Brillouin scattered light with minimized noise. Additionally, the system is able to calculate an accurate Brillouin frequency quickly by calculating a Brillouin gain difference when the pump signal is on/off.

BRIEF DESCRIPTION OF THE DRAWINGS

To describe the technical solution of the present disclosure or the conventional technology more clearly, below is a brief introduction of drawings necessary for description of the embodiments. Like reference numerals are used to identify similar elements in one or more drawings. It should be understood that the accompanying drawings are for illustration purposes only and not intended to limit the embodiments of the present disclosure. Additionally, for clarity of description, various modifications such as exaggeration and omission may be made to some of the elements in the accompanying drawings.

FIG. 7 is a diagram showing a range in which a Brillouin gain is calculated using a pump signal modulated with a pulsed gating signal and a probe signal according to an embodiment.

DETAILED DESCRIPTION

The terminology used herein is for the purpose of describing particular embodiments only and is not intended to be limiting of the present disclosure. As used herein, the singular forms are intended to include the plural forms as well, unless the context clearly indicates otherwise. It should be understood that the term "and/or" as used herein includes any or all possible combinations of one or more relevant items in a list.

The use of the terms "first", "second", and the like is used to describe various parts, components, areas, layers and/or sections, but is not limited thereby. These terms are used to distinguish one part, component, region, layer or section from another. Accordingly, a first part, component, region, layer or section stated herein may be a second part, component, area, layer or section without departing from the scope of the present disclosure.

The terminology used herein is for the purpose of describing particular embodiments only and is not intended to be limiting of the present disclosure. As used herein, the singular forms are intended to include the plural forms as well, unless the context clearly indicates otherwise. It will be further understood that the terms "comprises" when used in this specification, specify the presence of stated features, regions, integers, steps, operations, elements, and/or components, but do not preclude the presence or addition of one or more other features, regions, integers, steps, operations, elements and/or components.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, the embodiments of the present disclosure will be described in detail with reference to the accompanying drawings.

Figure 1A:
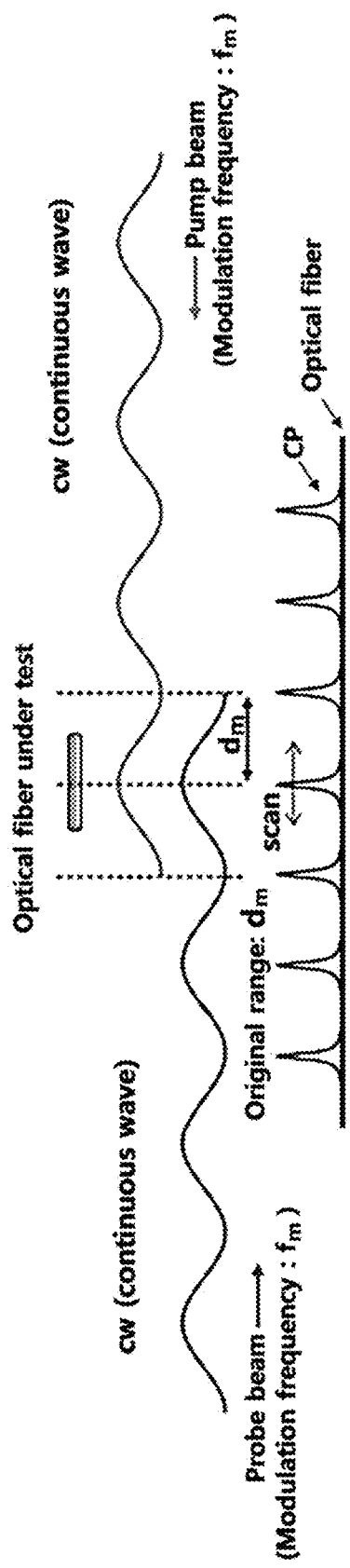
FIGS. 1A and 1B are conceptual diagrams of the principle of Brillouin Optical Correlation Domain Analysis (BOCDA) and a sensing system using the same according to an embodiment.
Figure 1B:
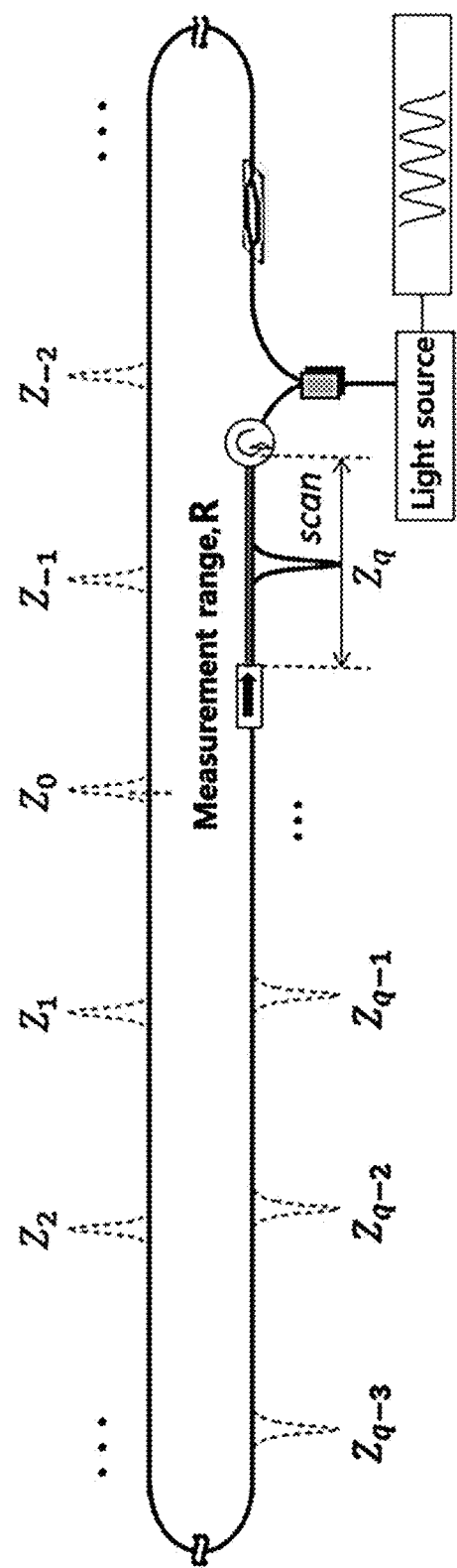

FIGS. 1A and 1B are conceptual diagrams of the principle of Brillouin Optical Correlation Domain Analysis (BOCDA) and a sensing system using the same according to an embodiment.

Referring to FIG. 1A, in the Brillouin Optical Correlation Domain Analysis based distributed optical fiber sensing system, when a frequency difference between pump beam and probe beam propagating in opposite directions within an optical fiber under test is equal or close to the intrinsic Brillouin shift frequency of the optical fiber, induced Brillouin scattering amplification takes place over the entire optical fiber and the intensity of probe beam is amplified.

In this instance, by modulating an optical signal so that the frequency of pump beam and probe beam has spatially sine waveform, it is possible to selectively acquire a Brillouin scattering signal only at a specific location in the optical fiber under test. In detail, a difference between the frequency of pump beam and the frequency of probe beam is constant over time at a specific location in the optical fiber. The specific location is referred to as a correlation point. The correlation point at which a frequency difference between pump beam and probe beam is constant appears every half cycle of the modulation frequency of pump beam and probe beam, and when a frequency difference between pump beam and probe beam matches the intrinsic Brillouin shift frequency of the optical fiber, induced Brillouin scattering occurs at the correlation point and scattered light is obtained. The induced Brillouin scattering appears in the form of a peak having a Brillouin gain in the spectrum of scattered light.

The measurement range R shown in FIG. 1B may be determined based on the modulation frequency of laser beam for generating pump beam and probe beam. The Brillouin gain spectrum may be measured at varying offset frequencies between pump beam and probe beam. The Brillouin shift frequency of the optical fiber under test to which pump beam and probe beam will be applied relies on the external physical properties such as temperature or strain. As a result, a change in the physical properties of the optical fiber under test may be measured using the frequency at which the Brillouin gain spectrum is maximum.

In contrast, according to embodiments of the present disclosure, the pump beam and/or the probe beam is modulated with pulsed wave, not continuous wave. For example, when only the pump beam is modulated with pulsed wave, the probe beam amplified by interaction with the counter-propagating pump beam is divided by the time period, and the signal is processed in the time domain. Accordingly, when multiple correlation points are located within the measurement range, the BOCDA system can simultaneously use the multiple correlation points, for example, N correlation points, located within the measurement range. As a result, the embodiments of the present disclosure can measure a wider measurement range quickly. Subsequently, when both the pump beam and the probe beam are modulated with pulsed wave, it is possible to use one correlation point within a narrower measurement range than the above-described measurement range, and precisely measure the narrow measurement range.

Figure 2:
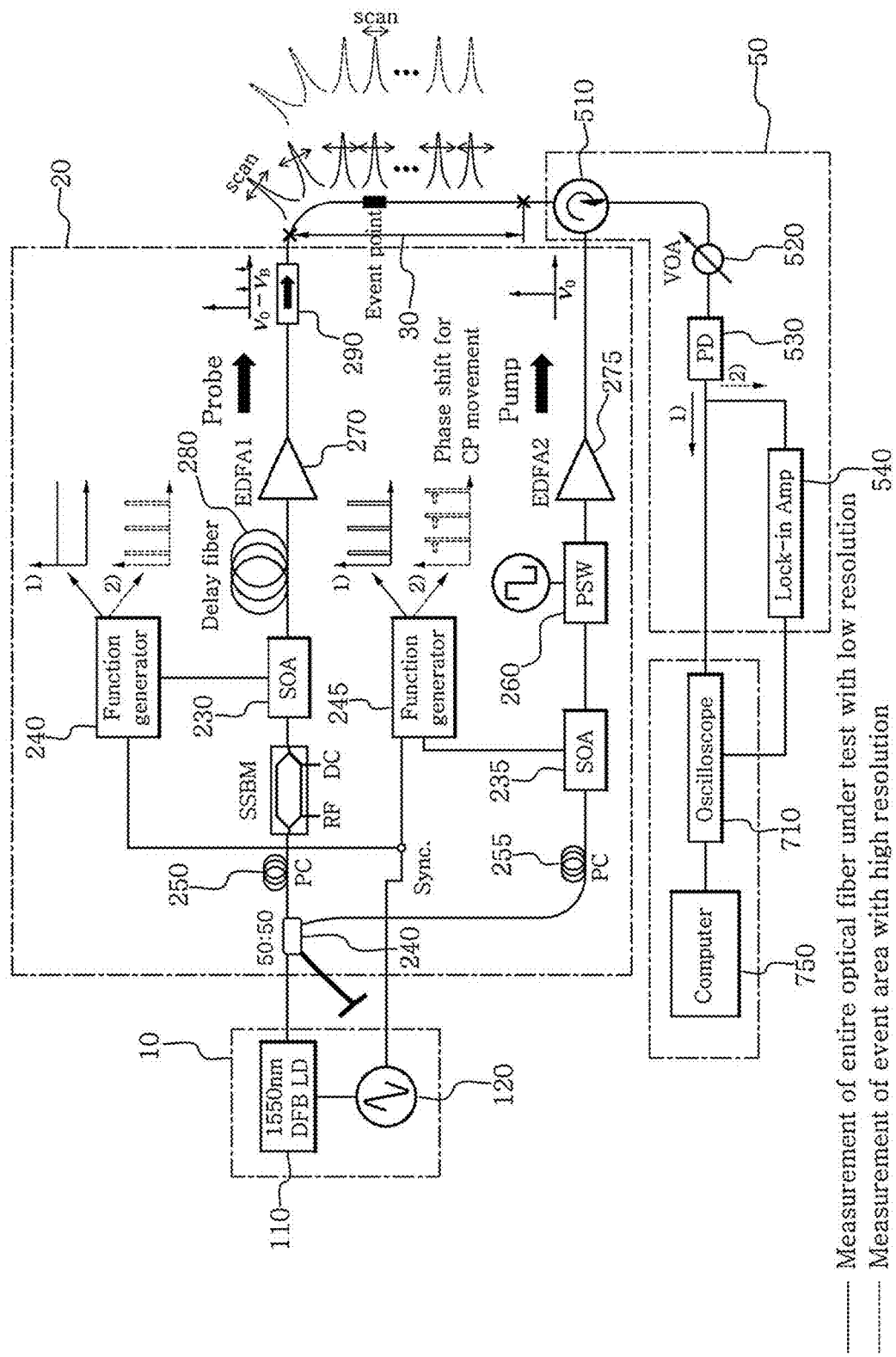
FIG. 2 is a conceptual diagram of a dual Brillouin distributed optical fiber sensing system according to an embodiment.

FIG. 2 is a conceptual diagram of a dual Brillouin distributed optical fiber sensing system according to an embodiment.

Referring to FIG. 2, the dual Brillouin distributed optical fiber sensing system according to this embodiment may include a light source unit 10, a light modulation unit 20, an optical fiber under test 30, a light detection unit 50 and a control unit 70. The optical fiber under test 30 may be placed on a location to measure a change in physical quantity using Brillouin scattering on the light path. For example, to measure a change in physical quantity of a target, the optical fiber under test 30 may be attached to the target.

The light source unit 10 is a device for supplying light used to operate the distributed optical fiber sensing system. In an embodiment, the light source unit 10 may include a Distributed Feed-Back Laser Diode (DFB LD) 110 and a waveform generator 120. When the current supplied to the DFB LD 110 is modulated using the waveform generator 120, a laser beam modulated with sine wave having a predetermined frequency may be obtained. However, this is provided for illustration only, and in other embodiments, the light source unit 10 may include other types of laser generators.

The spatial resolution of the dual Brillouin distributed optical fiber sensing system is determined by the actual frequency variation Δf modulated by the waveform generator 120. As the modulation frequency variation Δf is larger, the higher spatial resolution may be obtained.

The light modulation unit 20 is configured to receive the modulated laser beam from the light source unit 10, generate a pump signal and a probe signal from the laser beam and apply them to two ends of the optical fiber under test 30. In this instance, the light modulation unit 20 generates a pump signal that is time gated using a pulsed gating signal to individually analyze probe amplification by Brillouin scattering occurring at each of multiple correlation points. Here, the gating signal has the temporal width determined based on the modulation frequency of the laser beam. In an embodiment, the temporal width of the pulse of the pump signal is used to modulate the laser beam, and is a cycle $1/f_m$ of a modulating signal having modulation frequency $f_m$. In this instance, the probe signal may be a continuous wave signal or a time gated signal like the pump signal.

In an embodiment, the light modulation unit 20 includes an optical splitter 210, a first modulator 220, a second modulator 230 and a third modulator 235. The optical splitter 210 may receive the modulated laser beam from the light source unit 10, and split the received laser beam into a plurality of branches. For example, the optical splitter 210 may split the laser beam applied from the light source unit 10 into a first output beam for generating a probe signal and a second output beam for generating a pump signal. In an embodiment, the optical splitter 210 may be a 50:50 optical splitter, but is not limited thereto.

The first modulator 220 is optically connected between the optical splitter 210 and one end of the optical fiber under test 30, and generates a probe signal including a sideband signal using the first output beam of the optical splitter 210. That is, the first modulator 220 generates an optical signal by shifting the frequency of the laser beam by a predetermined offset frequency. For example, the first modulator 220 may be a Single Side Band Modulator (SSBM) that receives the first output beam having frequency v0, and generates an optical signal including a sideband signal of frequency v0-vB shifted by offset frequency vB.

The second modulator 230 is optically connected between the first modulator 220 and one end of the optical fiber under test 30, and modulates the optical signal including the shifted frequency v0-vB with the gating signal to generate a probe signal. For example, the second modulator 230 may be a Semiconductor Optical Amplifier (SOA).

The light modulation unit 20 may further include a first waveform generator 240 to provide the gating signal to the second modulator 230. In an embodiment, the first waveform generator 240 may provide different types of gating signals according to a range to measure, and a further detailed description will be provided with reference to FIGS. 3 and 4.

The third modulator 235 is connected between the optical splitter 210 and the other end of the optical fiber under test 30, and modulates the second output beam of the optical splitter 210 with the pulsed gating signal to generate a time gated pump signal. For example, the third modulator 235 may be a Semiconductor Optical Amplifier (SOA). Additionally, the light modulation unit 20 may further include a second waveform generator 245 to provide the pulsed gating signal to the third modulator 235.

Figure 3:
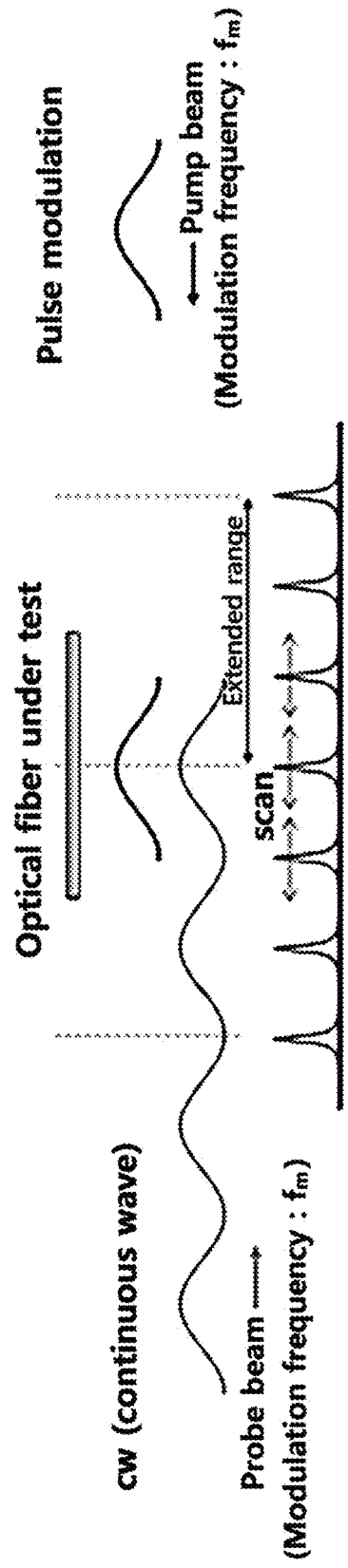
FIG. 3 is a conceptual diagram illustrating a process of amplifying a probe signal by interaction between the continuous wave probe signal and a pump signal modulated with a pulsed gating signal according to an embodiment.

FIG. 3 is a conceptual diagram illustrating a process of amplifying the probe signal by interaction between the continuous wave probe signal and the pump signal modulated with the pulsed gating signal according to an embodiment.

In an embodiment, when measuring a wide range, the first waveform generator 240 provides a constant signal such as constant DC voltage to the second modulator 230 to allow the input optical signal to pass through the second modulator 230. As a result, the second modulator 230 generates a probe signal as a continuous signal. In contrast, the second waveform generator 245 provides a pulsed gating signal to the third modulator 235, and the third modulator 235 generates a timed gated pump signal.

In an embodiment, the gating signal of the first waveform generator 240 and/or the second waveform generator 245 of the light modulation unit 20 may be synchronized with the modulating signal of the waveform generator 120 of the light source unit 10. Accordingly, when the modulation frequency of modulating with sine wave changes, the shape and phase of the pump signal and/or the probe signal modulated with the pulsed gating signal may be constantly maintained. In some embodiments, the first waveform generator 240 of the light modulation unit 20 may be set to be synchronized with the modulating signal of the waveform generator 120 of the light source unit 10 only when the third modulator 230 modulates with the pulsed gating signal.

When the generated continuous wave probe signal and the pump signal modulated with the pulsed gating signal travel in opposite directions, the probe beam is amplified at all correlation points through which they pass.

Referring to FIG. 3, the pump signal pulse and the probe signal simultaneously pass through a region of the optical fiber under test including a first correlation point CP1 in opposite directions, and in this instance, a frequency difference between the pump signal and the probe signal is constant at the first correlation point CP1. As a result, in FIG. 3, after a period of time of the half cycle Δt of the pump signal passes, the amplitude of the probe signal having passed through the first correlation point CP1 increases to a predetermined level. That is, the probe signal is amplified.

After another period of time of 2Δt passes, the pump signal pulse and the probe signal meet again at a second correlation point CP2 at which a frequency difference of the two signals is constant. As a result, the probe signal having passed through the second correlation point CP2 is amplified. This process is performed on all correlation points (CP3, etc.) through which the pump signal pulse passes, located in the optical fiber under test 30.

According to analysis of the generated Brillouin scattered light divided by the time period during which the pump signal pulse passes through the correlation point, it is possible to simultaneously use multiple correlation points, for example, N correlation points, located within the measurement range, thereby expanding the measurement range by N times while maintaining high spatial resolution.

For example, in the BOCDA system, when the light source is modulated at $f_m$=10 MHz, Δf=1.95 GHz and the effective refractive index n of the optical fiber under test is 1.45, the measurement range calculated by the following equation 1 has the distance of about 10.34 m between adjacent correlation points.

$$R = \frac{v_g}{2f_m} = \frac{c}{2nf_m} \qquad \text{[Equation 1]}$$

However, in FIG. 3, when 150 correlation points are located within the measurement range and they are simultaneously used, the measurement range extends to about 1.5 km. Additionally, because it is possible to measure by simultaneously using 150 correlation points, the measureable range can be measured at higher speed than the embodiment of FIG. 1.

Figure 4:
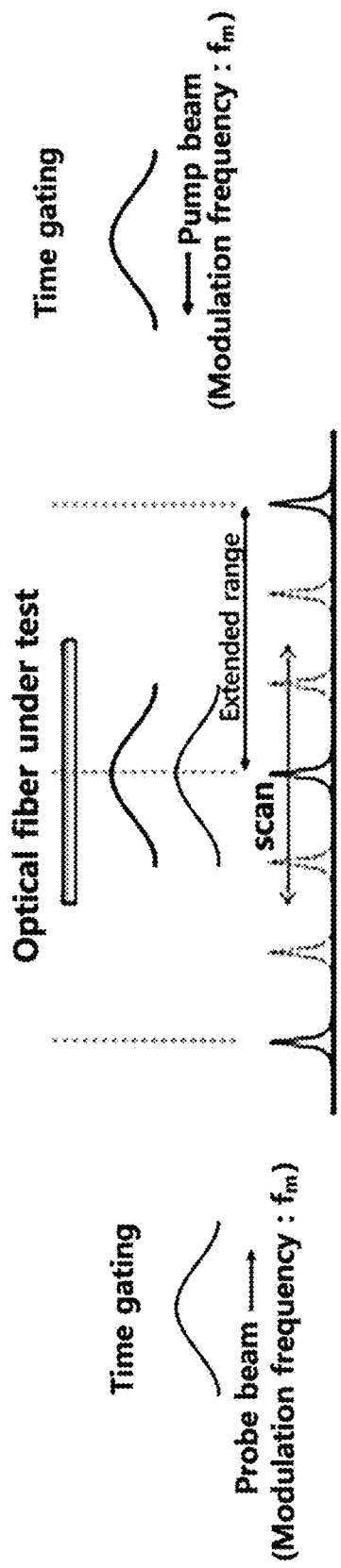
FIG. 4 is a conceptual diagram illustrating a process of amplifying a probe signal by interaction between a pump signal modulated with a pulsed gating signal and the probe signal according to an embodiment.

FIG. 4 is a conceptual diagram illustrating a process of amplifying the probe signal by interaction between the pump signal modulated with the pulsed gating signal and the probe signal according to an embodiment.

When measuring a certain range included in the measurement range of FIG. 3, the second waveform generator 240 also provides a pulsed gating signal to the second modulator 230. The second modulator 230 generates a probe signal that is time gated using the pulsed gating signal.

As described above, when the pump signal modulated with the pulse signal and the probe signal travel in opposite directions, the probe beam is amplified at a correlation point through which they pass. In some embodiments, only some of the correlation points of FIG. 3 may serve as a correlation point used in substantial measurement. For example, one of the correlation points of FIG. 3 may be used in substantial measurement. The correlation point used in substantial measurement is determined by the pulse width of the gating signal of the first waveform generator 240 and/or the gating signal of the second waveform generator 245 and a phase difference between the two gating signals. In some embodiments, a phase difference between the two gating signals may be determined by the second waveform generator 245. For example, the second waveform generator 245 may shift the phase of the gating signal as shown in FIG. 1.

When one correlation point is located in a narrow range to measure, a Brillouin gain only appears at the correlation point, and a Brillouin gain is not obtained at other points within the narrow range due to no interaction between the pump beam and the probe beam.

As described above, it is possible to efficiently measure the wide or narrow range according to the modulation type of the probe signal. The modulation type of the probe signal is controlled according to a signal transmitted from the control unit 70 to the second waveform generator 245.

Referring back to FIG. 2, in an embodiment, the light modulation unit 20 further includes a first Polarization Controller (PC) 250 and a second PC 255 to polarize incident laser beam in the same direction. The PCs 250 and 255 match the polarization of the first and second output beam of the optical splitter 210 prior to generation of pump and probe signals using the output beam of the optical splitter 210.

Additionally, in an embodiment, the light modulation unit 20 further includes a polarization switch 260. The polarization of the probe signal and pump signal matches, induced Brillouin scattering amplification occurs, and thus the polarization of the pump signal and probe signal may be equally adjusted using the polarization switch 260. Although in this embodiment, the polarization switch 260 is optically connected between the third modulator 235 and the optical fiber under test 30 to adjust the polarization of the pump signal, in other embodiments, the polarization of the probe signal may be adjusted by the polarization switch 260.

In an embodiment, the polarization switch 260 is configured to rotate the polarization of the pump signal or the probe signal by 0° and 90° in an alternating manner. When the polarization of the pump signal and probe signal matches, induced Brillouin scattering amplification occurs, but the polarization of the pump signal and/or the probe signal may change depending on time and space. Accordingly, measurement is performed while changing the polarization of the pump signal or the probe signal using the polarization switch 260, and the polarization problem may be solved using an average of measured values. The above-described polarization angles of 0° and 90° are provided for illustration only, and the polarization of the pump signal or the probe signal may be periodically changed to other different angles.

In an embodiment, the light modulation unit 20 further includes first and second optical fiber amplifiers 270, 275 to amplify the probe signal and the pump signal respectively. The first optical fiber amplifier 270 may be optically connected between the first modulator 220 and one end of the optical fiber under test 30. Additionally, the second optical fiber amplifier 275 may be optically connected between the third modulator 235 and the other end of the optical fiber under test 30. The first and second optical fiber amplifiers 270, 275 may be an Erbium-Doped Fiber Amplifier (EDFA), but are not limited thereto.

In an embodiment, the light modulation unit 20 further includes a delay fiber 280 optically connected to the optical fiber under test 30. The delay fiber 280 is an auxiliary optical fiber used to prevent a correlation point (order of magnitude q=0) that is located in the middle of the traveling path of the pump signal and the probe signal and does not change the location even though the modulation frequency changes, from being located within the optical fiber under test 30, and the order of magnitude of the correlation point at which a Brillouin gain peak occurs in the optical fiber under test 30 may be adjusted by properly adjusting the length of the delay fiber 280.

In an embodiment, the light modulation unit 20 further includes an optical isolator 290 optically connected between the delay fiber 280 and the optical fiber under test 30. The optical isolator 290 may serve to prevent the high output pump signal having passed through the optical fiber under test 30 from entering the delay fiber 280 in the reverse direction.

The light detection unit 50 detects Brillouin scattered light generated at multiple correlation points or a specific correlation point located in the optical fiber under test 30.

In an embodiment, the light detection unit 50 includes an optical circulator 510 optically connected between the second optical fiber amplifier 275 and the optical fiber under test 30. The optical circulator 510 serves to apply the time gated pulsed pump signal to the optical fiber under test 30, and allow the Brillouin scattered light generated in the optical fiber under test 30 to travel in the direction of different components of the light detection unit 50.

In an embodiment, the light detection unit 50 includes a Variable Optical Attenuator (VOA) 520 and a Photo Detector (PD) 530 for level adjustment and conversion of the signal. Brillouin scattered light generated while the pump signal and probe signal pass through the optical fiber under test 30 may pass through the optical circulator 510 and enter the VOA 520, the VOA 520 may attenuate the incident Brillouin scattered light and send it to the PD 530, and the PD 530 may convert the incident optical signal to an electrical signal.

In an embodiment, the light detection unit 50 further includes a lock-in amplifier 540 to detect the amplified optical signal at one correlation point more accurately in the precise measurement process of the specific range. The lock-in amplifier 540 may discontinuously detect Brillouin scattered light by using the gating signal generated by the second waveform generator 245 as a reference signal to modulate the pump signal.

The lock-in amplifier 540 may include an AC signal channel, a mixer, a DC amplifier and a low-pass filter, but is not limited thereto.

In an embodiment, the lock-in amplifier 540 may operate only in a specific mode. For example, the lock-in amplifier 540 operates to measure only a specific part of the optical fiber under test 30. In some embodiments, the lock-in amplifier 540 may be set to operate only in this specific mode. In some other embodiments, the lock-in amplifier 540 may be connected to the light path, and may operate after the specific part to measure is set. In this case, the light detection unit 50 may further include a switch (not shown) disposed on the light path that is inputted to the lock-in amplifier 540.

The control unit 70 includes a data acquisition (DAQ) 710 and a data processor 750. For example, the DAQ 710 may include an oscilloscope to acquire the electrical signal outputted from the PD 530 and the DC voltage signal outputted from the lock-in amplifier 540 in the time domain, and the data processor 750 may include a Personal Computer including one or more processes for analyzing a signal from the oscilloscope. However, this is provided for illustration only, and in other embodiments, signal processing and analysis may be performed by using one or more other additional data processing means.

The data processor 750 may calculate a Brillouin gain from Brillouin scattered light detected from one correlation point or multiple correlation points. For example, the data processor 750 calculates a Brillouin gain at each of the multiple correlation points through which the pump signal modulated with the pulsed gating signal passes, by processing Brillouin scattered light generated at the multiple correlation points in the time domain. Additionally, the data processor 750 calculates a Brillouin gain at one correlation point through which the pump signal modulated with the pulsed gating signal and the probe signal pass. Additionally, the data processor 750 may calculate the Brillouin frequency at the correlation point based on the calculated Brillouin gain.

Additionally, the data processor 750 determines whether an event occurred based on the calculated Brillouin frequency, and sets a location in which the event occurred as an event area. Here, the event refers to an abnormal change in the physical properties (For example, temperature, strain, etc.) of the surrounding environment, and may be called "abnormality", "non-normality", etc. Because the Brillouin frequency relies on the physical properties of the optical fiber under test 30, when the physical properties of the optical fiber under test 30 change with a change in the surrounding environment, the Brillouin frequency also changes. The data processor 750 determines that an event occurred when the Brillouin frequency abnormally changes.

In an embodiment, when a change in Brillouin frequency at a location of the optical fiber under test is above a predetermined range, the data processor 750 determines that an event occurred at the location. Here, in the case of temperature, the predetermined range may be 3° C., and in the case of strain, may be 1000 μm. However, the predetermined range is not limited thereto, and may be variously set based on the surrounding environment of the optical fiber under test 30, for example, the size, material and structure of the target to which the optical fiber under test 30 is attached.

In another embodiment, the data processor 750 may determine whether an event occurred by comparing a prestored Brillouin frequency pattern (normal pattern) with Brillouin frequency calculated in real time.

Additionally, the data processor 750 is electrically connected to at least one of the components included in the dual Brillouin distributed optical fiber sensing system, and is configured to transmit an electrical signal to instruct the operation of a sensing method using Brillouin scattering. For example, the data processor 750 may set an event area that is a specific part of the optical fiber under test 30 to measure, and enable the first waveform generator 240 to provide a pulse signal, i.e., a gating signal to the second modulator 230. Additionally, the data processor 750 may change the phase of the gating signal of the third waveform generator 245 by controlling the third waveform generator 245. Additionally, when the event area is set, the data processor 750 may transmit the electrical signal to the optical switch and control the light path to direct Brillouin scattered light to the lock-in amplifier 540.

Figure 5:
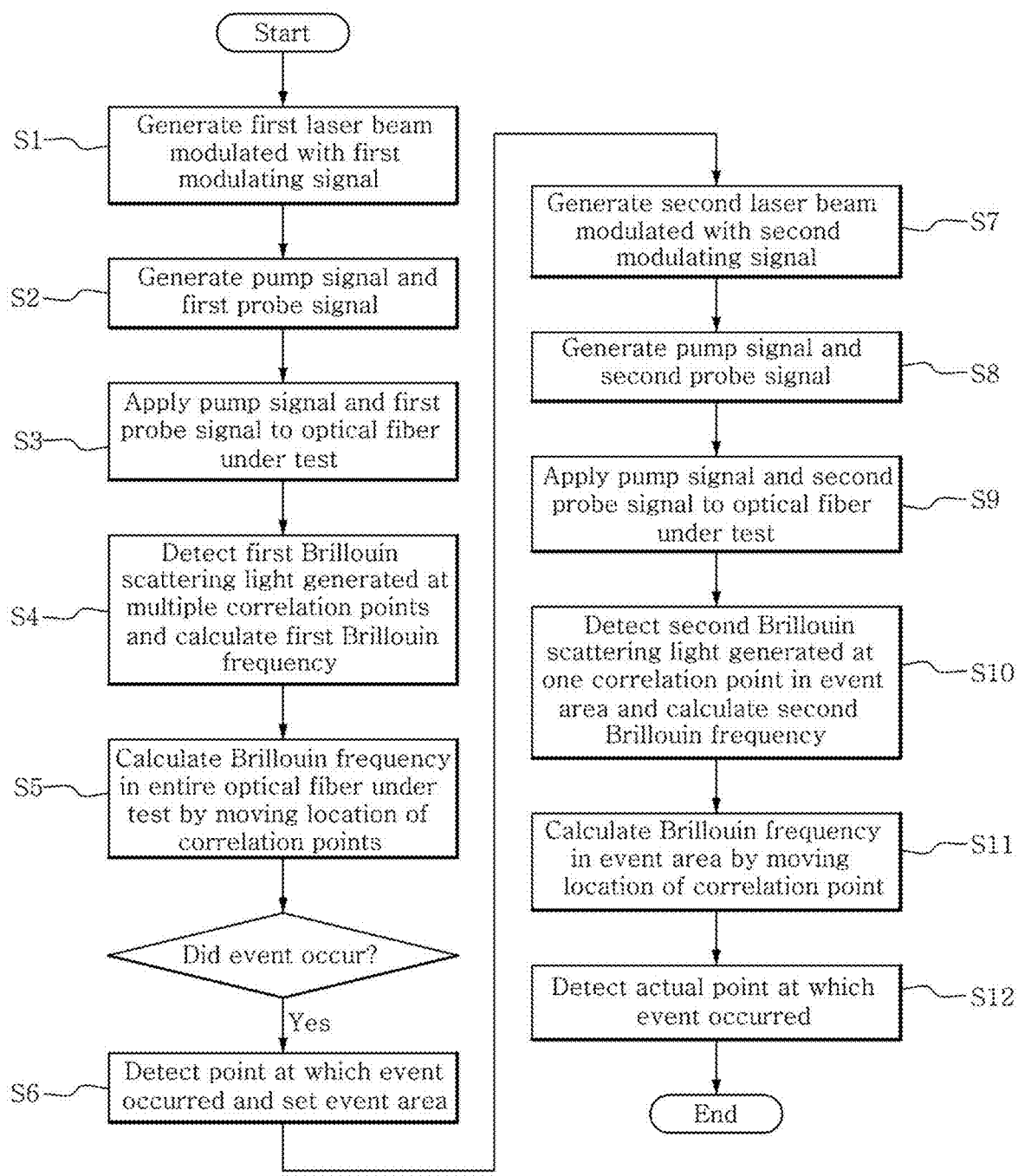
FIG. 5 is a flowchart of a sensing method using Brillouin scattering according to an embodiment.

FIG. 5 is a flowchart of a sensing method using Brillouin scattering according to an embodiment. The sensing method using Brillouin scattering includes detecting an area in which an event occurred at high speed by using multiple correlation points (S1-S6), and when abnormality occurred, precisely measuring the corresponding area (S7-S12). For example, the spatial resolution in the high-speed detection process may be set to 0.5 m, and the spatial resolution in the precise measurement process may be set to 10 mm.

Referring to FIG. 5, first, a first laser beam modulated with a first modulating signal may be generated (S1). The first modulating signal has a modulation frequency variation $\Delta f_1$ for setting the spatial resolution to 0.5 m. Subsequently, a pump signal and a first probe signal that is different from the frequency of the pump signal may be generated from the first laser beam (S2). The first probe signal is a continuous wave, and is generated by shifting the frequency $f_{m1}$ of the first laser beam by a predetermined offset frequency. The pump signal is generated by modulation with a pulsed gating signal to use multiple correlation points in detecting whether abnormality occurred. To individually analyze amplification of the probe beam by Brillouin scattering occurred at each of the multiple correlation points, the pulse width $\tau_m$ of the gating signal for the pump signal may be determined to be equal to one cycle of the sine wave modulating signal having modulation frequency $f_m$.

Subsequently, the pump signal and the probe signal are applied to an optical fiber under test 30 in different directions (S3). Subsequently, first Brillouin scattered light generated in the optical fiber under test is detected and a first Brillouin frequency in the optical fiber under test is calculated (S4). In S4, a process of calculating the Brillouin frequency based on the first Brillouin gain may be further performed.

The S4 may include detecting Brillouin scattered light generated at the multiple correlation points located in the optical fiber under test, calculating a Brillouin gain at each of the multiple correlation points using Brillouin scattered light for the multiple correlation points, and calculating the Brillouin frequency for each of the multiple correlation points based on the first Brillouin gain.

The Brillouin frequency at which the Brillouin gain is maximum linearly changes depending on the temperature and strain applied to the optical fiber, and thus it is possible to measure a change in the physical properties of the corresponding point by calculating the Brillouin frequency at the multiple correlation points on the optical fiber under test.

Additionally, the Brillouin frequency in part or all of the optical fiber under test 30 may be calculated by performing iteration while slightly moving the locations of the correlation points by slightly shifting the first modulation frequency $f_{m1}$ (S5). In an embodiment, the distribution type of Brillouin frequency near the correlation point may be calculated by controlling the first modulation frequency. Accordingly, the distribution type of Brillouin frequency near each of the multiple correlation points may be calculated.

Figure 6:
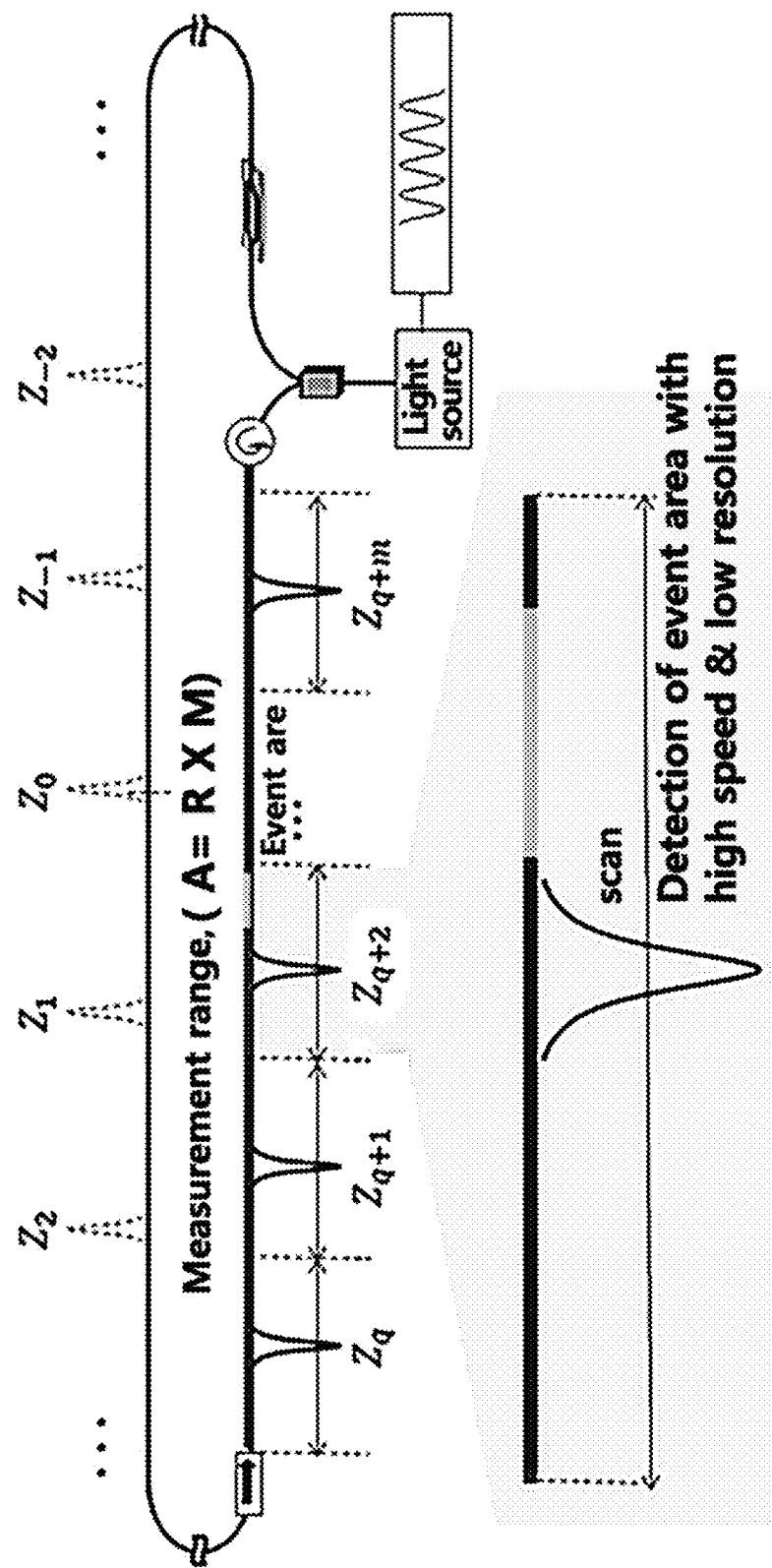
FIG. 6 is a diagram showing a range in which a Brillouin gain is calculated using a continuous wave probe signal and a pump signal modulated with a pulsed gating signal according to an embodiment.

FIG. 6 is a diagram showing a range in which the Brillouin frequency is calculated using the continuous wave probe signal and the pump signal modulated with the pulsed gating signal according to an embodiment.

When Brillouin scattered light generated based on the continuous wave probe signal and the time gated pump signal is resolved in the time domain, a Brillouin gain at each of multiple correlation points may be calculated. Particularly, it takes a much shorter time when a Brillouin gain at each of multiple correlation points is calculated with low resolution (0.5 m).

When measuring a long range of the same length, the system of FIG. 1 measures only one measurement point at a time and repeats the measurement while moving over the entire range R (for example, 10 measurements per second). However, as opposed to that, the embodiment of FIG. 3 performs signal processing in the time domain to measure only the range from each correlation point to adjacent correlation points while simultaneously moving multiple measurement points arranged at a regular interval, thereby significantly reducing the measurement time.

Referring back to FIG. 5, after the Brillouin gain and Brillouin frequency at the multiple correlation points are calculated quickly with low resolution (S1-S5), whether an event occurred in the optical fiber under test 30 and a point at which the event occurred are detected (S6). In an embodiment, the control unit 70 determines that an event occurred when a change in Brillouin frequency is above the predetermined range (S6). The control unit 70 detects a correlation point at which the change in Brillouin frequency above the predetermined range occurred, and sets a specific range including the corresponding correlation point as an event area to detect an accurate location at which the event occurred.

In an embodiment, the control unit 70 sets a re-measurement range based on the spatial resolution in S4. For example, as a result of measuring with 0.5 m spatial resolution, when it is determined that the event occurred at a specific point, the corresponding 0.5 m including the point at which the event occurred is set as an event area B (S6).

Subsequently, only the area at which abnormality occurred (i.e., the event area) is measured with higher spatial resolution than the spatial resolution of the steps S1-S5.

After S6, a second laser beam modulated with a second modulating signal is generated (S7), and a second probe signal modulated with a pulsed gating signal is generated (S8). The second modulating signal has a second modulation frequency variation $\Delta f_2$ for performing measurement with higher spatial resolution (10 mm). The second probe signal is generated by modulation with the pulsed gating signal having the width of $\tau_m$ to measure the event area again with higher spatial resolution. That is, both the pump signal and the probe signal are modulated with the pulsed gating signal having the width of $\tau_m$. In S8, a process of controlling a phase difference between the two gating signals so that one correlation point is located in the re-measurement range, i.e., the event area may be further performed.

Subsequently, the second probe signal and the pump signal are applied to the optical fiber under test in different directions (S9), and the Brillouin frequency in the event area is calculated by detecting Brillouin scattered light generated at the correlation point located in the event area (S10). In an embodiment, the control unit 70 calculates a Brillouin gain from Brillouin scattered light of the event area, and calculates the Brillouin frequency (S10).

Additionally, the method may further include measuring Brillouin frequency in part or all of the event area by repeating the above-described processes S7-S10 while slightly moving the location of the correlation points by slightly changing the second modulation frequency $f_{m2}$ (S11). In an embodiment, the Brillouin frequency near one correlation point located in the event area may be calculated at partial distribution by controlling the second modulation frequency $f_{m2}$.

Accordingly, the actual location C in which the event occurred is detected (S12). Further, it is possible to measure a change in the physical properties of the surrounding environment more precisely.

FIG. 7 is a diagram showing a range in which the Brillouin gain is calculated using the pump signal modulated with the pulsed gating signal and the probe signal according to an embodiment.

As a result of performing S7-S11, the actual position C at which the event occurred in the set event area B is detected.

In an embodiment, the S11 may further include detecting one or more Brillouin scattered light generated at the same correlation point, and detecting an averaged signal for the one or more detected Brillouin scattered light. The averaged signal may be detected through the lock-in amplifier 540.

For example, with Brillouin scattering occurred in the optical fiber under test 30 having the effective refractive index n of 1.45, first, the light source is modulated at $f_m=10$ MHz, $\Delta f=0.195$ GHz, and the entire measurement range A of about 1.5 km is measured with 0.5 m spatial resolution. When multiple correlation points are simultaneously measured while changing a frequency difference between the pump signal and the probe signal at an interval of 2 MHz from 200 MHz around Brillouin frequency ($\Delta vB=30$ MHz) using the embodiments of the present disclosure, it is possible to individually obtain the Brillouin gain at each of the multiple correlation points. Subsequently, a location in the optical fiber under test in which the event occurred is determined by measuring the Brillouin frequency at each of the multiple correlation points through analysis of the obtained Brillouin gains. When it is determined that the event occurred at a specific point, the event area B including the corresponding point may be set.

Subsequently, the light source is modulated at $f_m=10$ MHz, $\Delta f=9.75$ GHz and the event area B is measured with more precise spatial resolution of 10 mm. As a result, the actual event point C located in the event area B may be detected.

The sensing method using Brillouin scattering spends about 16 sec in measuring the entire range of the optical fiber under test 30 of 1.5 km with the spatial resolution of 0.5 m (S1-S5), and spends about 5 sec in re-measuring only 0.5 m set as the event area with the spatial resolution of 10 mm (S7-S10), and thus spends about 21 sec in accurately detecting the point at which the event occurred. It is possible to measure about 714 times faster, compared to the embodiment of FIG. 1 that requires 15000 sec when measuring with the spatial resolution of 10 mm from the start.

The steps described in FIG. 5 are provided for illustration only, and the sensing method using Brillouin scattering may be performed in a different order or part of the process may be omitted or changed. For example, when it is determined that an event occurred at multiple points in S6, multiple event areas may be set. In this case, the S7-S11 may be performed many times for each event area.

While the present disclosure has been hereinabove described with reference to the embodiments shown in the drawings, this is provided for illustration purposes only and those skilled in the art will understand that various modifications and variations may be made thereto. However, it should be noted that such modifications fall in the technical protection scope of the present disclosure. Accordingly, the true technical protection scope of the present disclosure should be defined by the technical spirit of the appended claims.

What is claimed is:

1. A dual Brillouin distributed optical fiber sensing system, comprising:
   an optical fiber under test;
   a light source unit which generates a laser beam modulated with a modulating signal having a modulation frequency;
   a light modulation unit configured to generate a pump signal and a probe signal using the laser beam, and apply the pump signal and the probe signal to the optical fiber under test from different directions, wherein the pump signal is time gated using a pulsed gating signal;

a light detection unit which detects Brillouin scattered light generated by the pump signal and the probe signal at correlation points located in the optical fiber under test; and a control unit which determines whether an event occurred in the optical fiber under test based on the detected Brillouin scattered light, and when the event occurred, sets an event area including a point at which the event occurred, wherein when the event area is not set, the light modulation unit is configured to generate a probe signal by shifting a frequency of the laser beam by a predetermined offset frequency, and when the event area is set, to generate a probe signal time gated by further using a gating signal.

2. The dual Brillouin distributed optical fiber sensing system according to claim 1, wherein the light modulation unit comprises:

a first modulator which changes the frequency of the laser beam by a predetermined offset frequency;

a first waveform generator which generates a constant signal when the event area is not set, and generates a pulsed gating signal when the event area is set; and a second modulator configured to generate a first optical signal using the signal generated from the first waveform generator.

3. The dual Brillouin distributed optical fiber sensing system according to claim 2, wherein the first waveform generator generates a pulsed gating signal having a same temporal width as a reciprocal of the modulation frequency of the laser beam.

4. The dual Brillouin distributed optical fiber sensing system according to claim 2, wherein the light modulation unit comprises:

a second waveform generator which generates a pulsed gating signal; and a third modulator configured to generate a pump beam using the gating signal of the second waveform generator, and wherein the second waveform generator shifts a phase of the gating signal.

5. The dual Brillouin distributed optical fiber sensing system according to claim 1, wherein the control unit comprises:

a data collector which acquires a signal for the Brillouin scattered light; and a data processor which calculates a Brillouin gain and a Brillouin frequency using the signal for the Brillouin scattered light, determines whether an event occurred based on the Brillouin frequency, and sets a location at which the event occurred as an event area.

6. The dual Brillouin distributed optical fiber sensing system according to claim 5, wherein the data processor is configured to calculate the Brillouin gain at each of multiple correlation points on the light path when the event area is not set, and calculate the Brillouin gain at one correlation point located on the event area when the event area is set.

7. The dual Brillouin distributed optical fiber sensing system according to claim 5, wherein when a change in the Brillouin frequency at a location of the optical fiber under test is above a predetermined range, the data processor determines that an event occurred at the location.

8. The dual Brillouin distributed optical fiber sensing system according to claim 1, wherein when the event area is not set, the modulation frequency has a first modulation frequency variation for setting a first spatial resolution, and when the event area is set, the modulation frequency has a second modulation frequency variation for setting a second spatial resolution, and the first spatial resolution is lower than the second spatial resolution.

9. The dual Brillouin distributed optical fiber sensing system according to claim 8, wherein the event area is set by the control unit based on the first spatial resolution.

10. The dual Brillouin distributed optical fiber sensing system according to claim 1, further comprising:

a lock-in amplifier to detect an averaged signal for one or more Brillouin scattered light generated at a same correlation point.

11. The dual Brillouin distributed optical fiber sensing system according to claim 10, wherein the lock-in amplifier operates only when the event area is set.

12. A sensing method using Brillouin scattering, comprising:

generating a first laser beam modulated with a first modulating signal;

generating a pump signal and a first probe signal from the first laser beam, wherein the first probe signal is different from a frequency of the pump signal, and the pump signal is generated by modulation with a pulsed gating signal;

applying the pump signal and the probe signal to an optical fiber under test in different directions;

detecting a first Brillouin scattered light generated in the optical fiber under test, and calculating a first Brillouin frequency in the optical fiber under test;

determining whether an event occurred based on the first Brillouin frequency, and setting an event area including a location at which the event occurred;

generating a second laser beam signal modulated with a second modulating signal;

generating a second probe signal time gated using a pulsed gating signal;

applying the second probe signal and the pump signal to the optical fiber under test in different directions; and calculating a second Brillouin frequency in the event area based on a second Brillouin scattered light generated at a correlation point located in the event area, wherein the first modulating signal has a first modulation frequency variation for setting a first spatial resolution, and the second modulating signal has a second modulation frequency variation for setting a second spatial resolution that is higher than the first spatial resolution.

13. The sensing method using Brillouin scattering according to claim 12, wherein the detecting the first Brillouin scattered light generated in the optical fiber under test and calculating the first Brillouin frequency in the optical fiber under test comprises:

detecting Brillouin scattered light generated at multiple correlation points located in the optical fiber under test;

calculating a Brillouin gain at each of the multiple correlation points using the Brillouin scattered light for the multiple correlation points; and calculating a Brillouin frequency for each of the multiple correlation points based on the Brillouin gains at each of the multiple correlation points.

14. The sensing method using Brillouin scattering according to claim 13, wherein the calculating the first Brillouin frequency in the optical fiber under test further comprises:

calculating the Brillouin frequency for each of the multiple correlation points at partial distribution representing Brillouin frequency distribution near the corresponding correlation point by controlling the first modulation frequency.

15. The sensing method using Brillouin scattering according to claim 13, wherein the setting the event area based on the first Brillouin gain comprises:
detecting a correlation point having a change in the Brillouin frequency above a predetermined range; and
setting an event area based on a location of the correlation point.

16. The sensing method using Brillouin scattering according to claim 12, further comprising:
after the generating the second probe signal, controlling a phase difference between the pump signal and the second probe signal so that one correlation point is located in the event area.

17. The sensing method using Brillouin scattering according to claim 12, wherein the detecting the second Brillouin scattered light generated at the correlation point located in the event area further comprises detecting an averaged signal for one or more Brillouin scattered light generated at the one correlation point.

18. The sensing method using Brillouin scattering according to claim 12, further comprising:
calculating the Brillouin frequency for one correlation point located in the event area at partial distribution by controlling the second modulation frequency.

* * * * *